US006792333B2

(12) United States Patent
Yamazaki

(10) Patent No.: US 6,792,333 B2
(45) Date of Patent: Sep. 14, 2004

(54) PRODUCT MANAGEMENT METHOD, PROGRAM FOR PERFORMING PRODUCT MANAGEMENT, AND STORAGE MEDIUM HAVING RECORDED THE PROGRAM THEREIN

(75) Inventor: Shunpei Yamazaki, Tokyo (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/441,014

(22) Filed: May 20, 2003

(65) Prior Publication Data

US 2003/0225473 A1 Dec. 4, 2003

(30) Foreign Application Priority Data

Jun. 4, 2002 (JP) ........................................ 2002-163297
Jun. 11, 2002 (JP) ........................................ 2002-169819

(51) Int. Cl.[7] ................................................ G06F 7/04
(52) U.S. Cl. ...................... 700/227; 700/95; 427/2.23; 705/57
(58) Field of Search ........................... 347/163; 700/95, 700/227; 705/57; 164/229; 427/2.17, 2.2, 2.23

(56) References Cited

U.S. PATENT DOCUMENTS

| 5,361,150 A | * | 11/1994 | Noguchi ...................... 349/84 |
| 6,229,557 B1 | * | 5/2001 | OOyama ..................... 347/200 |
| 6,395,151 B1 | * | 5/2002 | Schramm et al. ...... 204/192.38 |

FOREIGN PATENT DOCUMENTS

JP          2001274269 A  * 10/2001  ........... H01L/23/00

\* cited by examiner

*Primary Examiner*—Albert W. Paladini
(74) *Attorney, Agent, or Firm*—Nixon Peabody LLP; Jeffrey L. Costellia

(57) ABSTRACT

A product management method for securing interests of a just rightful claimant of an intellectual property right is provided. The product management method is a product management method for a display module including a circuit formed by integrating a transistor which is formed using a thin film semiconductor on an insulating substrate, which, in a manufacturing process of the transistor, forms characters, a figure, a symbol, or a numeral, or a combination thereof on any one of thin films constituting the transistor, indicates attribution of an intellectual property right pertaining to the display module according to the characters, the figure, the symbol, or the numeral, or the combination thereof, and secures interests of a just rightful claimant of an intellectual property right.

34 Claims, 11 Drawing Sheets

PRODUCT MANAGEMENT METHOD, PROGRAM FOR PERFORMING PRODUCT MANAGEMENT, AND STORAGE MEDIUM HAVING RECORDED THE PROGRAM THEREIN

BACKGROUND OF THE INVENTION

1. Field of the Invention

The present invention relates to a method of managing a product protected by an intellectual property right (including a patent right, a utility model right, a design right, a trademark right, a copyright, or a right of circuit arrangement use; this also applies in the following description).

2. Description of the Related Art

In recent years, a semiconductor technique in an electronics field has made remarkable development, and integrated circuits (ICs) or large-scale integrations (LSIs) are incorporated even in very familiar portable devices. Consequently, demands have been increasing not only for ICs and LSIs but also for compound integrated circuits in which these are functionally integrated. In addition, since it is expected that electrification of household articles will further progress from now on, potential demands are extremely large.

However, lifecycles of familiar portable electronic devices utilizing an IC or the like (e.g., a cellular phone, a PDA, etc.) are short, and it is not rare that a model of a product is changed in two to three years or in about one year in some cases. Manufacturing consignees of products with a short lifecycle are forced to reduce a period for product development and reduce a delivery period, and to bear more burdens in that development costs cannot be recovered finally and a burden of capital investment is heavy. In particular, in a business form such as a major company which performs all of research and development, mask design, and manufacturing thoroughly in the company, the company itself bears all of the above-mentioned burdens and cannot distribute risks.

Therefore, recently, a business form has been increasing in which a mask design company (so-called design house) produces a photo mask based upon a design of the company and passes the photo mask to a semiconductor manufacturing consigned company (foundry) together with a license to manufacture a product in consignment. A foundry is a company which specializes in manufacturing, owns a large-scale production line, and manufactures and delivers a product according to a request from a consigning company as its business. The production line is characterized in that it can cope with various specifications and requests from the consigning company and owns a manufacturing ability for coping with production of many kinds of products in small quantities.

A consigned company is mainly a company not owning its own factory, a so-called fabless, which can avoid risks due to the burden of capital investment by utilizing a foundry and can apply its own capital to research and development. In addition, even a major company distinguishes burden of development and burden of capital investment by consigning a manufacturing portion to a foundry to perform risk avoidance such as prevention of a problem of inability to recover development costs. As described above, as a matter of fact, the number of companies has been increasing which utilize a foundry with an aim of coping with the risk avoidance by distribution of risks of each company and the increase in demands for electronic products with a short lifecycle.

However, some products manufactured in a foundry do not have an imprint of a part number or the like and do not include information on a manufacturer, a consignor, and the like. Although these products are consigned to some foundry by a certain consignor and manufactured, manufactures and consignors thereof cannot be specified. Here, a most significant problem is a problem of intellectual property rights. That is, even if a product infringing an intellectual property right is included in products manufactured in the foundry, it is likely that interests of a just rightful claimant is spoiled because an object on which a right should be exercised cannot be specified.

SUMMARY OF THE INVENTION

The present invention has been devised in view of the above-mentioned problems, and it is an object of the present invention to secure interests of a just rightful claimant of an intellectual property right and to provide a product management method for clearly confirming attribution of rights.

Note that examples of a representative product in the present invention include a liquid crystal display module, an electroluminescent (EL) display module, and other display modules (which, in this specification, is assumed to indicate a display panel which is modularized with a terminal attached), or semiconductor integrated circuits such as a logic IC and an IC for special applications (ASIC).

The present invention is a product management method including the following structure. That is, the present invention is a product management method for a display module or a semiconductor integrated circuit including a circuit constituted by integrating transistor which is formed using a thin film semiconductor on a substrate, which is characterized in that at least one of thin films constituting the transistor to form information indicating a specific subject relating to the display module or the semiconductor integrated circuit in a manufacturing process of the transistor and clarify the specific subject. Here, the specific subject relating to the display module or the semiconductor integrated circuit indicates a person involved in manufacturing, sales, designing, or other related duties of the display module or the semiconductor integrated circuit. This also has an objective of clarifying attribution of an intellectual property right for the display module or the semiconductor integrated circuit.

In addition, the formation of the information indicating a specific subject is attained by forming characters, a figure, a symbol, or a numeral, or a combination thereof using at least one of thin films constituting a transistor. That is, a specific subject relating to a display module or a semiconductor integrated circuit is clarified according to an indication of characters, a figure, a symbol, or a numeral, or a combination thereof (hereinafter referred to as marking). Note that "person" includes not only an individual but also a corporation or an organization having a judicial personality as well as a country, a municipal corporation, or an independent administrative agency.

That is, the present invention is characterized in that, in a manufacturing process of a transistor to be formed as a component of a display module or a semiconductor integrated circuit, characters, a figure, a symbol, or a numeral, or a combination thereof is formed, by patterning a thin film, using a photolithography step, an etching step, or the like which is a part of the manufacturing process, whereby attribution of an intellectual property right, that is, a rightful claimant of the intellectual property right, a person licensed to use the intellectual property right, or a person responsible for the intellectual property right is clarified.

In the present invention, other than indicating a rightful claimant of an intellectual property right for the display module or the semiconductor integrated circuit according to the indication of characters, a figure, a symbol, or a numeral, or a combination thereof, a manufacturing consignee (manufacturing order receiver), a manufacturing consignor, a product receiver (which refers to a person equivalent to a shipment destination or a delivery destination of a manufactured display module or semiconductor integrated circuit; this also applies in the following description), or a product number (which refers to a part number, a product model, a model number, or other characters, numeral, symbol, or combination thereof attached for specifying a product; this also applies in the following description) of the display module or the semiconductor integrated circuit may be indicated. In addition, a designer (including a system designer, a circuit designer, and a mask designer; this also applies in the following description) of a circuit constituting the display module or the semiconductor integrated circuit, or a date of mask manufacturing may be indicated. It goes without saying that these may be written together. Note that a product receiver is not always a manufacturing consignor, and a third party different from the manufacturing consignor may be a product receiver.

In addition, in the present invention, the indication of a rightful claimant of an intellectual property right, or a manufacturing consignee, a manufacturing consignor, a product receiver, or a product number of a display module or a semiconductor integrated circuit, or a designer of a circuit constituting the display module or the semiconductor integrated circuit, or a date of mask manufacturing is not only performed by the rightful claimant of an intellectual property right (licensor) itself but can be obligatory to a licensee, who is licensed to use the intellectual property right. This obligation arises through an agreement to be entered into between the rightful claimant and the licensee. In addition, in the case in which the licensee consigns manufacturing to a subcontracting manufacturing consignee, it is also possible to obligate the licensee to show the indication to the manufacturing consignee.

Note that, the present invention is a method concerning product management of a liquid crystal display module, an EL display module, and other display module capable of displaying videos according to electric signals, or a logic IC, an IC for special applications, and other semiconductor integrated circuits. However, a relationship among "persons" such as a rightful claimant, a licensee, and a manufacturing consignee included in the configuration of the present invention is not limited to that of people belonging to an identical country but those having a relationship extending over two countries or a large number of countries are also included in the present invention.

Note that, although the method for marking which is a characteristic of the present invention only may be arranged among a rightful claimant of an intellectual property right, a licensee, and a manufacturing consignee, it is preferable to use a method with which a marking is not forged by a third party (infringer of a right). This is because, if a marking is forged by a third party, it is difficult to attain the present invention.

Therefore, the present invention becomes more effective by forming the marking using a peculiar technique owned by the rightful claimant of an intellectual property right or a technique which is publicly known technically but is not usually implemented by people other than the rightful claimant of the intellectual property right. In addition, if the peculiar technique itself has an intellectual property right, the value of marking can obtain a synergistic effect.

In addition, in order to prevent the marking method from being forged by a third party, as a method for this purpose, for example, it is sufficient to devise a method in performing the marking using a thin film on a substrate in a semiconductor field, although there are differences in manufacturing industries of each field. As a more specific method, it is sufficient to intentionally contain a specific element or substance in a part or all of characters, a figure, a symbol, or a numeral, or a combination thereof of the thin film constituting the marking.

Then, the rightful claimant of an intellectual property right can analyze characteristics of the thin film forming the marking and distinguish whether a product is infringing the intellectual property right by using, for example, a program characterized by adopting an SIMS (Secondary Ion Mass Spectroscopy) as means for reading the marking. In addition, the number of infringing products can be managed collectively by a computer using the program.

In addition, as the other methods for preventing the marking method from being forged by a third party, characteristics of the thin film constituting the marking may be changed periodically. As a specific method, it is sufficient to change selection of characters, a figure, a symbol, or a numeral, or a combination thereof in the thin film constituting the marking or change an arrangement thereof. In addition, in the case in which a specific element or substance is intentionally contained in a part or all of the thin film constituting the marking as described above, it is sufficient to change a concentration thereof. If these changing means are used, since there are countless methods of forming the marking, it is usually difficult to manage the methods of marking. Thus, it becomes easy to manage the methods accurately by managing a changed pattern of the thin film constituting the marking using a server (computer) as a management method. Here, a person who manages the server may be an administrator of an intellectual property right or may be a licensee (manufacturing consignee).

By using such a marking method, the marking can be prevented from being forged by a third party.

DESCRIPTION OF THE PREFERRED EMBODIMENTS

Embodiments of the present invention will be hereinafter described with reference to the accompanying drawings.

The present invention is characterized in that, in a manufacturing process of a display module or a semiconductor integrated circuit, a thin film material forming an electronic device such as a transistor is used as an indication (marking) indicating attribution of an intellectual property right. The electronic device may be formed in any part of the display module or the semiconductor integrated circuit as long as a circuit layout is not spoiled in that part.

Figure 1:
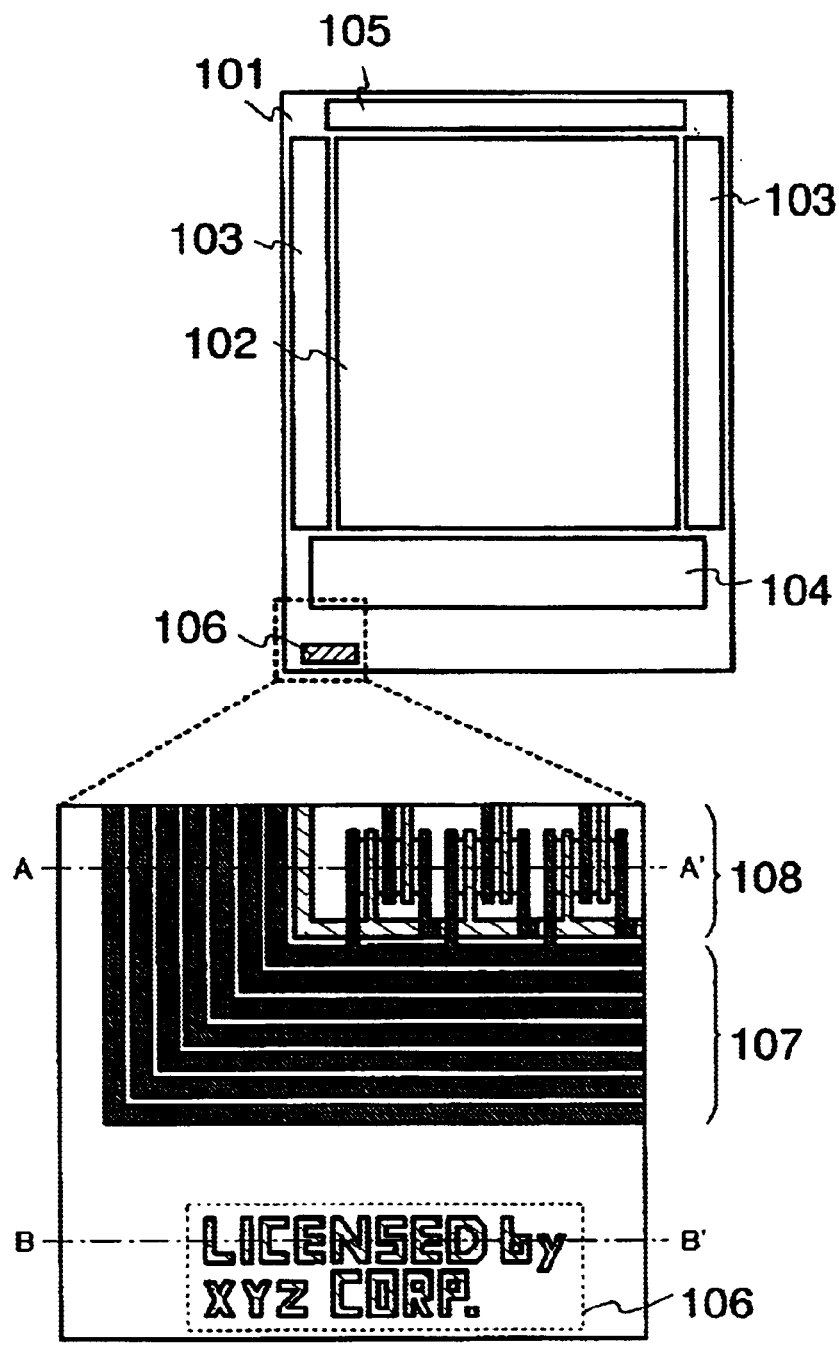
FIG. 1 is a view showing an active matrix substrate provided with an electronic device such as a transistor.

FIG. 1 shows a substrate provided with an electronic device such as a transistor (which is referred to as an active matrix substrate; this also applies in the following description) in a display module. The active matrix substrate of this embodiment mode includes a pixel section 102, a scanning side drive circuit 103, a signal side drive circuit 104, and a pre-charge circuit 105 on a substrate 101 but is not limited to this structure. In addition, as the substrate 101, a glass substrate, a plastic substrate, a quartz substrate, a ceramics substrate, a silicon substrate, or the like can be used. That is, the present invention not only can be implemented in the case in which a transistor using a so-called polysilicon film is formed on a glass substrate but also can be implemented in the case in which a transistor is formed on a silicon substrate.

A characteristic of the present invention is a marking section 106 provided on the substrate 101. In an enlarged view of an area surrounded by a dotted line, reference numeral 106 denotes the marking section, which is formed by patterning a thin film and displayed such that attribution of a right for a display module is clarified by characters, a figure, a symbol, or a numeral, or a combination thereof. In addition, reference numeral 107 denotes a group of wirings for transmitting a signal to the scanning side drive circuit 103 and the signal side drive circuit 104, and 108 denotes a group of transistors forming a part of the signal side drive circuit 104.

Contents of the indication in the marking section 106 only has to be determined appropriately by a person carrying out the indication and is not limited to the contents of the indication of FIG. 1. That is, contents are no object as long as a "person" carrying out the indication to specify in the marking section 106 can be identified. Here, characters or the like displayed in the marking section 106 are formed of the thin film constituting the group of wirings 107 and the group of transistors 108. Examples thereof are shown in FIGS. 2A to 4B.

Figure 2A:
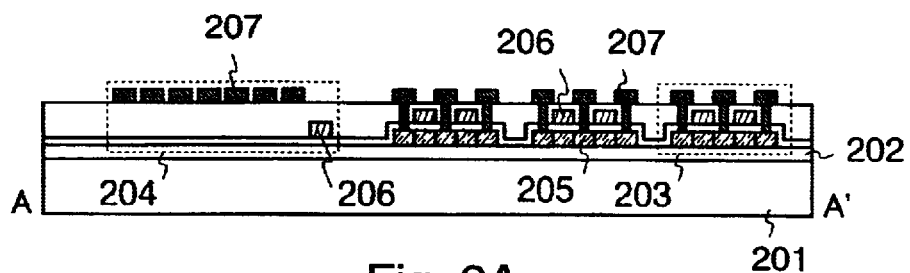
FIGS. 2A and 2B are views showing an active matrix substrate to which a marking is applied.
Figure 2B:
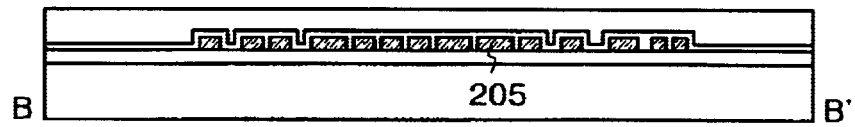

FIGS. 2A and 2B show an example in which a marking section is formed using a semiconductor film functioning as an active layer of a transistor and correspond to cross sections cut along A–A' and B–B' of FIG. 1, respectively. In FIG. 2A, a base film 202 is provided on a substrate 201 (corresponding to the substrate 101 of FIG. 1), and a transistor 203 is provided thereon. In addition, on the left side of FIG. 2A, a group of wirings 204 is provided. The transistor 203 includes, in its structure, a semiconductor film 205 to be an active layer, a first metal film 206 to be a gate electrode, and a second metal film 207 to be a source electrode or a drain electrode. These first metal film 206 and second metal film 207 are used also as wiring in the group of wirings 204. As shown in FIG. 2B, the marking section 106 is formed of the semiconductor film 205.

Figure 3A:
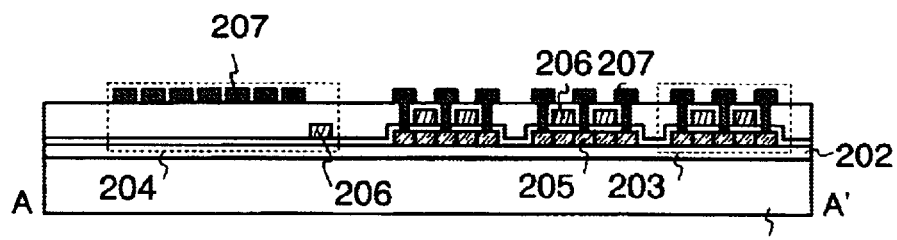
FIGS. 3A and 3B are views showing an active matrix substrate to which a marking is applied.
Figure 3B:
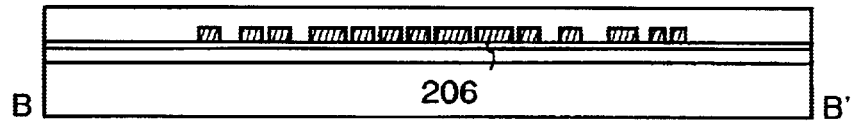

Next, FIGS. 3A and 3B show an example in which a marking section is formed using a first metal film to be a gate electrode of a transistor and correspond to cross sections cut along A–A' and B–B' of FIG. 1, respectively. Note that, since a structure of FIG. 3A is the same as the structure of FIG. 2A, description of the structure will be omitted. As shown in FIG. 3B, the marking section 106 is formed of the first metal film 206.

Figure 4A:
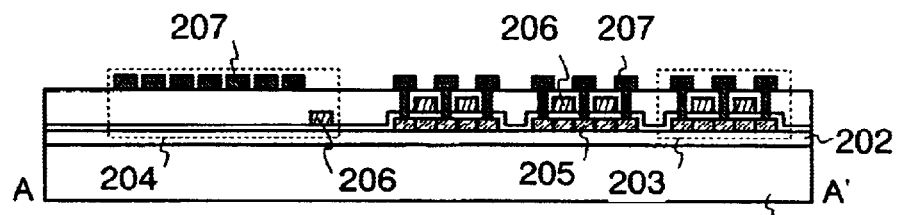
FIGS. 4A and 4B are views showing an active matrix substrate to which a marking is applied.
Figure 4B:
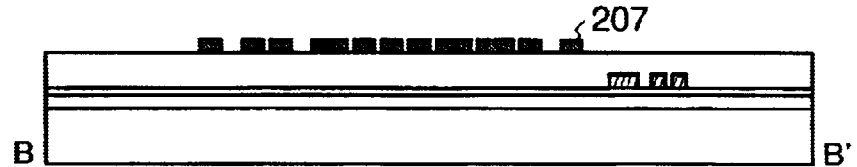

Next, FIGS. 4A and 4B show an example in which a marking section is formed using a second metal film to be a source electrode or a drain electrode of a transistor and correspond to cross sections cut along A–A' and B–B' of FIG. 1, respectively. Note that, since a structure of FIG. 4A is the same as the structure of FIG. 2A, description of the structure will be omitted. As shown in FIG. 4B, the marking section 106 is formed of the second metal film 207.

As described above, characters or the like displayed on the marking section 106 can be formed of a thin film constituting the group of wirings 107 or the group of transistors 108. It goes without saying that the marking section 106 may be formed by combining the semiconductor film 205, the first metal film 206, or the second metal film 207.

Figure 18:
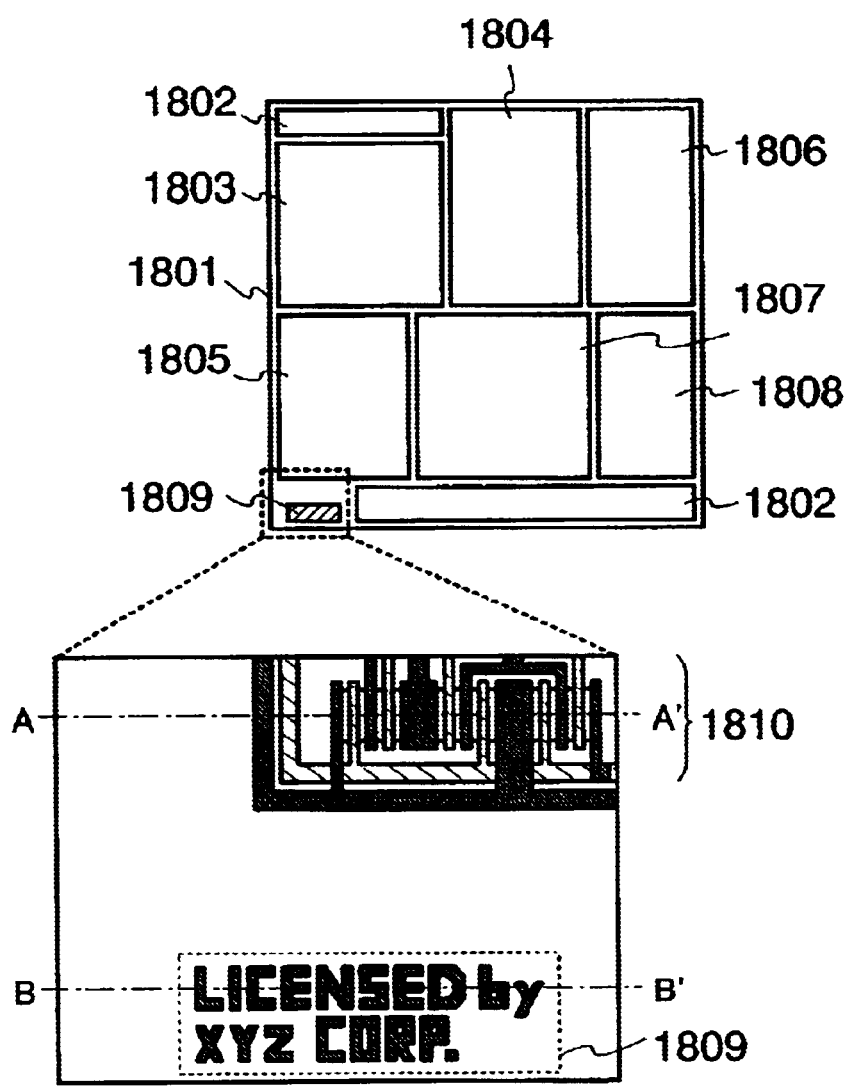
FIG. 18 is a view showing a logic substrate provided with an electronic device such as a transistor.

FIG. 18 shows a substrate provided with an electronic device such as a transistor (hereinafter referred to as a logic substrate; this also applies in the following description) in a semiconductor integrated circuit. The logic substrate of this embodiment mode includes a CPU core 1802, an I/O port 1803, a cache memory 1804, a cache controller 1805, a clock controller 1806, a flash memory 1807, and a serial interface 1808 on a substrate 1801 but is not limited to this structure. In addition, as the substrate 1801, a glass substrate, a plastic substrate, a quartz substrate, a ceramics substrate, a silicon substrate, or the like can be used. That is, the present invention not only can be implemented in the case in which a transistor using a so-called polysilicon film is formed on a glass substrate but also can be implemented in the case in which a transistor is formed on a silicon substrate.

A characteristic of the present invention is a marking section 1809 provided on the substrate 1801. In an enlarged view of an area surrounded by a dotted line, reference numeral 1809 denotes the marking section, which is formed by patterning a thin film and displayed such that information on a specific subject relating to a semiconductor integrated circuit (including attribution of a right for the semiconductor integrated circuit) is clarified by characters, a figure, a symbol, or a numeral, or a combination thereof. In addition, reference numeral 1810 denotes a group of transistors forming a part of the cache controller 1805.

Contents of the indication in the marking section 1809 only has to be determined appropriately by a person carrying out the indication and is not limited to the contents of the indication of FIG. 18. That is, contents are no object as long as a "person" carrying out the indication to specify in the marking section 1809 can be identified. Here, characters or the like displayed in the marking section 1809 are formed of the thin film constituting the group of transistors 1810. Examples thereof are shown in FIGS. 19 to 21.

Figure 19A:
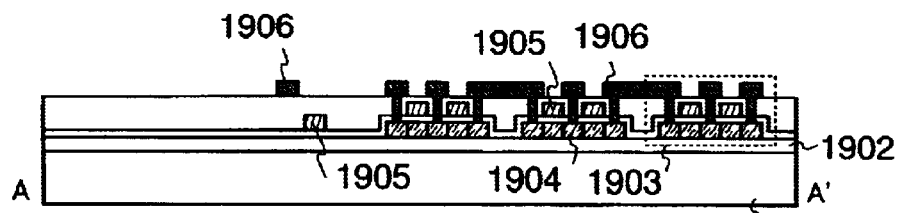
FIGS. 19A and 19B are views showing a logic substrate to which a marking is applied.
Figure 19B:
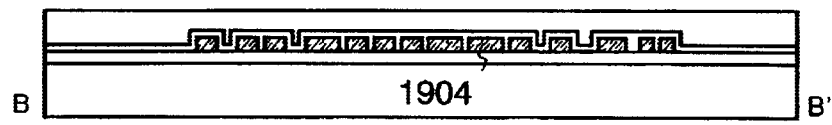

FIGS. 19A and 19B show an example in which a marking section is formed using a semiconductor film functioning as an active layer of a transistor and correspond to cross sections cut along A–A' and B–B' of FIG. 18, respectively. In FIG. 19A, a base film 1902 is provided on a substrate 1901 (corresponding to the substrate 1801 of FIG. 18), and a transistor 1903 is provided thereon. The transistor 1903 includes, in its structure, a semiconductor film 1904 to be an active layer, a first metal film 1905 to be a gate electrode, and a second metal film 1906 to be a source electrode or a drain electrode. These first metal film 1905 and second metal film 1906 are used also as wirings. As shown in FIG. 19B, the marking section 1809 is formed of the semiconductor film 1904.

Figure 20A:
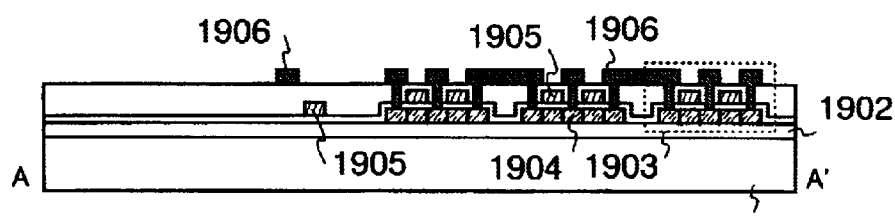
FIGS. 20A and 20B are views showing a logic substrate to which a marking is applied.
Figure 20B:
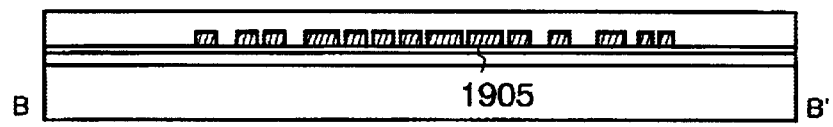

Next, FIGS. 20A and 20B show an example in which a marking section is formed using a first metal film to be a gate electrode of a transistor and correspond to cross sections cut along A–A' and B–B' of FIG. 18, respectively. Note that, since a structure of FIG. 20A is the same as the structure of FIG. 19A, description of the structure will be omitted. As shown in FIG. 20B, the marking section 1809 is formed of the first metal film 1905.

Figure 21A:
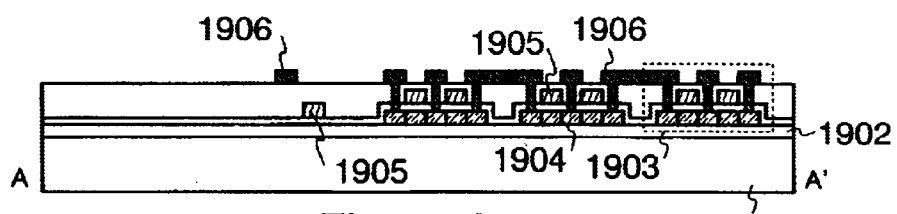
FIGS. 21A and 21B are views showing a logic substrate to which a marking is applied.
Figure 21B:
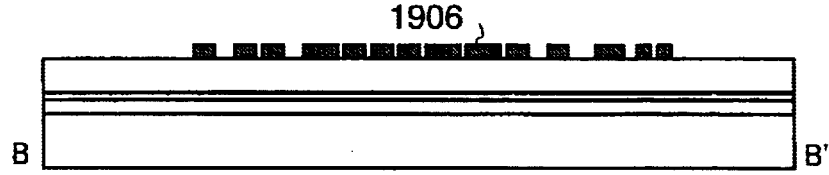

Next, FIGS. 21A and 21B show an example in which a marking section is formed using a second metal film to be a source electrode or a drain electrode of a transistor and correspond to cross sections cut along A–A' and B–B' of FIG. 18, respectively. Note that, since a structure of FIG. 21A is the same as the structure of FIG. 19A, description of the structure will be omitted. As shown in FIG. 21B, the marking section 1809 is formed of the second metal film 1906.

As described above, characters or the like displayed in the marking section 1809 can be formed of a thin film constituting the group of transistors 1810. It goes without saying that the marking section 1809 may be formed by combining the semiconductor film 1904, the first metal film 1905, or the second metal film 1906.

In implementing the present invention described above, since a subject applying a marking and a subject assuming the duty of applying a marking vary depending upon a form of carrying out a business, a specific form capable of implementing the present invention will be hereinafter described as an example. Note that it goes without saying that the present invention is not limited to embodiments described below.

First Embodiment

Figure 5:
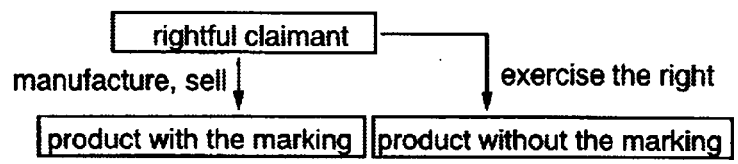
FIG. 5 shows a business form in which the present invention can be implemented.

As shown in FIG. 5, this embodiment is a form in which a rightful claimant of an intellectual property right applies a marking to its own product. The rightful claimant of an intellectual property right manufactures and sells the product by itself and applies a marking to a manufactured display module or semiconductor integrated circuit. That is, the rightful claimant can exercise a right considering that all products without the marking distributed in the market infringe its own intellectual property right. A computer may control forming, recording, reading, and judging the marking using a program recorded on a recording medium.

Second Embodiment

Figure 6:
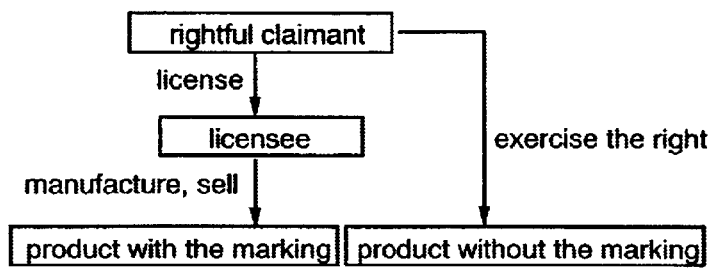
FIG. 6 shows a business form in which the present invention can be implemented.

As shown in FIG. 6, this embodiment is a form in which a rightful claimant of an intellectual property right licenses a third party (licensee) to use a right pertaining to its own intellectual property right and the licensee applies a marking to a product which the licensee sells. The licensee of the intellectual property right manufactures and sells a product by itself and applies a marking to a manufactured display module or semiconductor integrated circuit. That is, the licensee can exercise the right considering that all products without the marking distributed in the market infringe the intellectual property right of the rightful claimant of the intellectual property right. Note that the rightful claimant of the intellectual property right only has to obligate the licensee to apply the marking to the product according to an agreement to be arranged between the rightful claimant and the licensee. A computer may control forming, recording, reading, and judging the marking using a program recorded on a recording medium.

Third Embodiment

Figure 7:
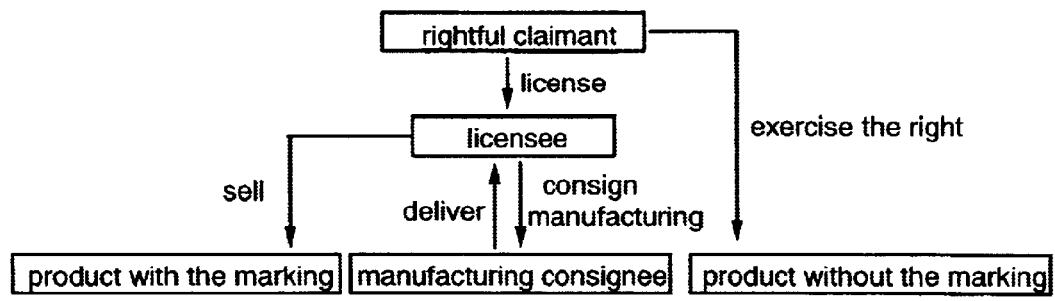
FIG. 7 shows a business form in which the present invention can be implemented.

As shown in FIG. 7, this embodiment is a form in which a rightful claimant of an intellectual property right licenses a third party (licensee) to use a right pertaining to its own intellectual property right, and the licensee applies a marking to a product which the licensee sells by itself. In this case, the licensee of the intellectual property right consigns manufacturing of a display module or a semiconductor integrated circuit to a manufacturing consignee, and the manufacturing consignee applies the marking to the product and further delivers it to the licensee (manufacturing consignor). The manufacturing consignee includes a foundry. In addition, a product receiver in this case is the licensee.

The licensee of the intellectual property right consigns manufacturing of the product to be sold by itself to the manufacturing consignee and, at the same time, obligates the manufacturing consignee to apply the marking to the product. In addition, if necessary, the rightful claimant of the intellectual property right may license the manufacturing consignee to use the right. The licensee of the intellectual property right is at least obligated by the rightful claimant of the intellectual property right to "obligate the manufacturing consignee to apply the marking to the product". As a result, the licensee can exercise the right considering that all products without the marking distributed in the market infringe the intellectual property right of the rightful claimant of the intellectual property right. Note that the rightful claimant of the intellectual property right only has to obligate the licensee to apply the marking (including obligation to further obligate the manufacturing consignee to apply the marking to the product) to the product according to an agreement to be arranged between the rightful claimant and the licensee. A computer may control forming, recording, reading, and judging the marking using a program recorded on a recording medium.

Fourth Embodiment

Figure 8:
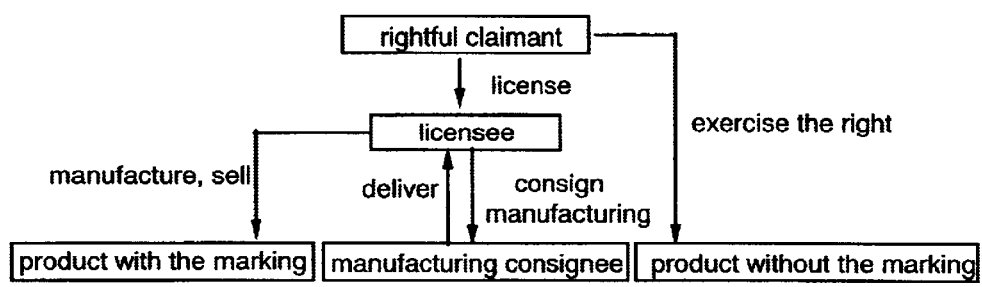
FIG. 8 shows a business form in which the present invention can be implemented.

As shown in FIG. 8, this embodiment is a form in which a rightful claimant of an intellectual property right licenses a third party (licensee) to use a right pertaining to its own intellectual property right, and the licensee applies a marking to a product which a licensee sells by itself. In this case, the licensee of the intellectual property right consigns manufacturing of a display module or a semiconductor integrated circuit to a manufacturing consignee, and the manufacturing consignee applies the marking to the product and further delivers it to the licensee (manufacturing consignor). Then, the delivered product is further processed and sold by the licensee. The manufacturing consignee includes a foundry. In addition, a product receiver in this case is the licensee.

The licensee of the intellectual property right consigns manufacturing of the product to be sold by itself to the manufacturing consignee and, at the same time, obligates the manufacturing consignee to apply the marking to the product. In addition, if necessary, the rightful claimant of the intellectual property right may license the manufacturing consignee to use the right. The licensee of the intellectual property right is at least obligated by the rightful claimant of the intellectual property right to "obligate the manufacturing consignee to apply the marking to the product". As a result, the licensee can exercise the right considering that all products without the marking distributed in the market infringe the intellectual property right of the rightful claimant of the intellectual property right. Note that the rightful claimant of the intellectual property right only has to obligate the licensee to apply the marking (including obligation to further obligate the manufacturing consignee to apply the marking) to the product according to an agreement to be arranged between the rightful claimant and the licensee. A computer may control forming, recording, reading, and judging the marking using a program recorded on a recording medium.

Fifth Embodiment

Figure 9:
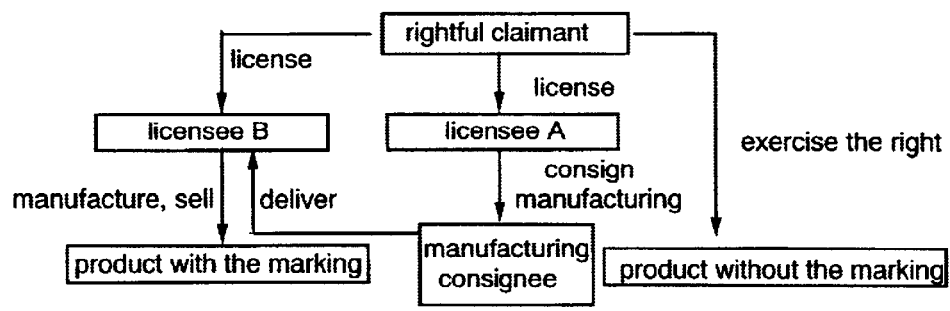
FIG. 9 shows a business form in which the present invention can be implemented.

As shown in FIG. 9, this embodiment is a form in which a rightful claimant of an intellectual property right licenses a third party (licensee A, B) to use a right pertaining to its own intellectual property right, and a manufacturing consignee consigned by the licensee A applies a marking to a display module or a semiconductor integrated circuit. In this case, the licensee A of the intellectual property right consigns manufacturing of the display module or the semiconductor integrated circuit to a manufacturing consignee, and the manufacturing consignee applies the marking to the product and further delivers it to a licensee B of the intellectual property right. Then, the delivered product is further processed and sold by the licensee B. The manufacturing consignee includes a foundry. In addition, in this case, a manufacturing consignor is the licensee A and a receiver of the product is the licensee B.

In the case of this embodiment, it does not matter under which name of the licensee A or the licensee B of the intellectual property right the product (the display module or the semiconductor integrated circuit) is sold. In addition, it may be sufficient for the rightful claimant of the intellectual property right to give a license to at least one of the licensee A or the licensee B of the intellectual property right.

In this embodiment, the licensee A of the intellectual property right who consigns manufacturing of the product to the manufacturing consignee is required to obligate the manufacturing consignee to apply the marking to the product. In addition, if necessary, the rightful claimant of the intellectual property right may license the manufacturing consignee to use the right. The licensees of the intellectual property right are at least obligated by the rightful claimant of the intellectual property right to "obligate the manufacturing consignee to apply the marking to the product". As a result, the licensees can exercise the right considering that all products without the marking distributed in the market infringe the intellectual property right of the rightful claimant of the intellectual property right. Note that the rightful claimant of the intellectual property right only has to obligate the licensees to apply the marking (including obligation to further obligate the manufacturing consignee to apply the marking) to the product according to an agreement to be arranged between the rightful claimant and the licensees.

Sixth Embodiment

Figure 10:
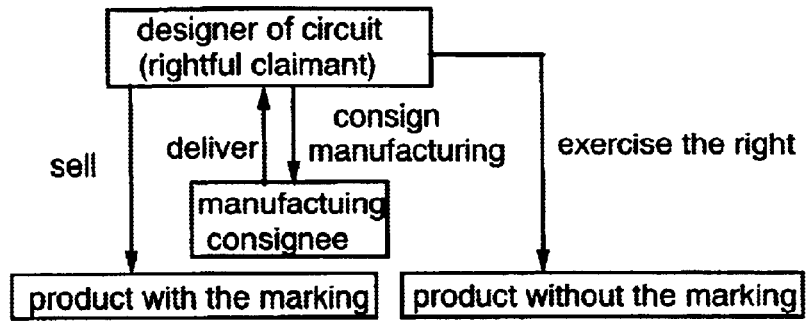
FIG. 10 shows a business form in which the present invention can be implemented.

As shown in FIG. 10, this embodiment is a form in which a rightful claimant of an intellectual property right is a person who performs system design, circuit design, mask design, or design of other circuits as trade (hereinafter referred to as a designer of circuits), and applies a marking to a display module or a semiconductor integrated circuit in selling its own product. In this case, the designer of circuits (the rightful claimant of the intellectual property right) consigns manufacturing of the display module or the semiconductor integrated circuit to a manufacturing consignee, and the manufacturing consignee applies the marking to the product and further delivers it to the designer of circuits. The manufacturing consignee includes a foundry. In addition, a product receiver in this case is the designer of circuits and includes a person who does not own its own production line (hereinafter referred to as a fabless).

In the business form described above, the designer of circuits can exercise the right considering that all products without the marking distributed in the market infringe the intellectual property right of the designer of circuits who is the rightful claimant of the intellectual property right. Note that the designer of circuits only has to obligate the manufacturing consignee to apply the marking to the product according to an agreement to be arranged between the designer of circuits and the manufacturing consignee. A computer may control forming, recording, reading, and judging the marking using a program recorded on a recording medium.

Seventh Embodiment

Figure 11:
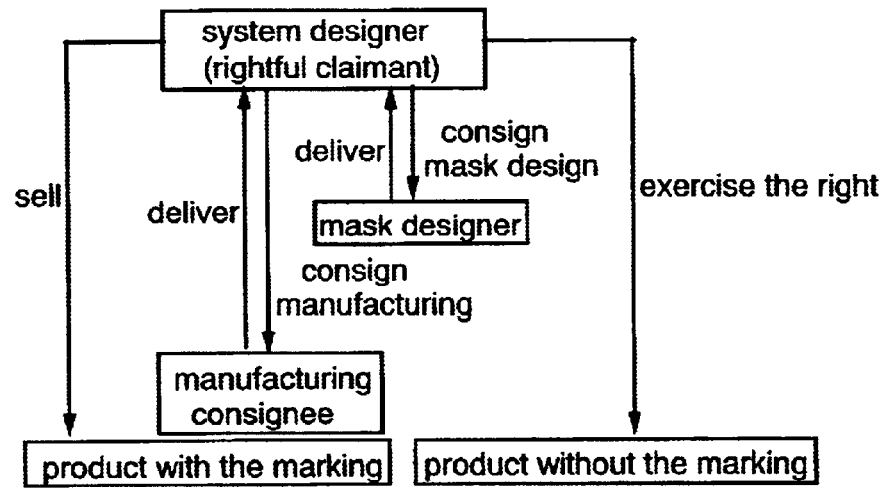
FIG. 11 shows a business form in which the present invention can be implemented.

As shown in FIG. 11, this embodiment is a form in which a rightful claimant of an intellectual property right is a person who performs system design as trade (hereinafter referred to as a system designer), and applies a marking to a display module or a semiconductor integrated circuit in selling its own product. In this case, the system designer (the rightful claimant of the intellectual property right) first consigns mask design to a person who performs mask design as trade (hereinafter referred to as a mask designer), passes design data of a delivered mask to a manufacturing consignee to consign manufacturing of a display module or a semiconductor integrated circuit to the manufacturing consignee, and the manufacturing consignee applies the marking to the product and further delivers it to the system designer (manufacturing consignor). The manufacturing consignee includes a foundry. In addition, a product receiver in this case is the system designer and includes a fabless.

In the business form described above, the system designer can exercise the right considering that all products without the marking distributed in the market infringe the intellectual property right of the system designer who is the rightful claimant of the intellectual property right. Note that the system designer only has to obligate the manufacturing consignee to apply the marking to the product according to an agreement to be arranged between the system designer and the manufacturing consignee. A computer may control forming, recording, reading, and judging the marking using a program recorded on a recording medium.

Eighth Embodiment

Figure 12:
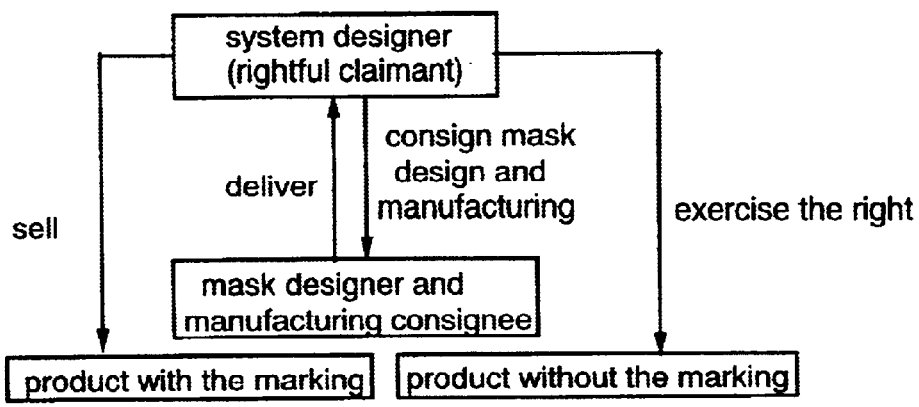
FIG. 12 shows a business form in which the present invention can be implemented.

As shown in FIG. 12, this embodiment is a form in which a rightful claimant of an intellectual property right is a person who performs system design as trade (hereinafter referred to as a system designer), and applies a marking to a display module or a semiconductor integrated circuit in selling its own product. In this case, the system designer (the rightful claimant of the intellectual property right) consigns work ranging from mask design to manufacturing to a manufacturing consignee who also performs mask design as trade, and the manufacturing consignee applies the marking to the product and further delivers it to the system designer (manufacturing consignor). The manufacturing consignee includes a foundry. In addition, a product receiver in this case is the system designer and includes a fabless.

In the business form described above, the system designer can exercise the right considering that all products without the marking distributed in the market infringe the intellectual property right of the system designer who is the rightful claimant of the intellectual property right. Note that the system designer only has to obligate the manufacturing consignee to apply the marking to the product according to an agreement to be arranged between the system designer and the manufacturing consignee. A computer may control forming, recording, reading, and judging the marking using a program recorded on a recording medium.

Ninth Embodiment

Figure 13:
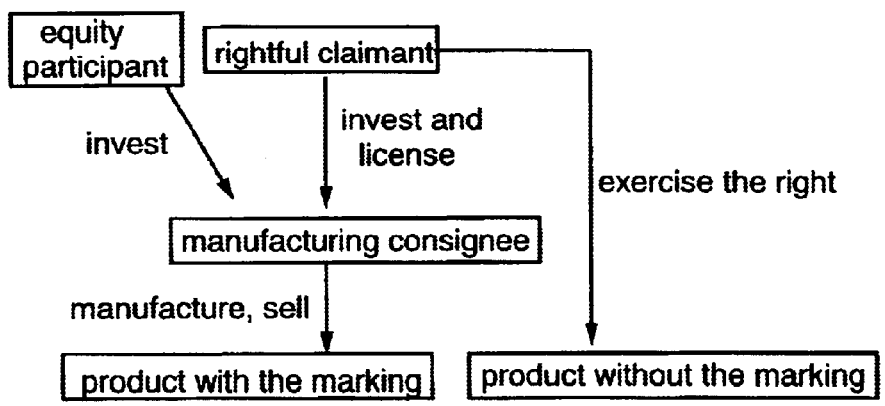
FIG. 13 shows a business form in which the present invention can be implemented.

As shown in FIG. 13, this embodiment is a form in which a rightful claimant of an intellectual property right makes an investment jointly with an equity participant to establish a manufacturing consignee and, at the same time, invests in and license the manufacturing consignee established by the joint investment to use the right, and applies a marking to a display module or a semiconductor integrated circuit in consigning manufacturing of the display module or the semiconductor integrated circuit.

The rightful claimant of the intellectual property right and the equity participant may be a fabless or a person who has its own production line. In addition, although the example in which a product is sold by the manufacturing consignee established by the joint investment is described in this embodiment, the product may be sold by the rightful claimant of the intellectual property right or may be sold the equity participant. In this case, the rightful claimant of the intellectual property right or the equity participant consigns manufacturing of a display module or a semiconductor integrated circuit to the manufacturing consignee, and the manufacturing consignee applies the marking to the product and sells it. The manufacturing consignee includes a foundry.

In the business form described above, the rightful claimant of the intellectual property right can exercise the right considering that all products without the marking distributed in the market infringe the intellectual property right of the rightful claimant of the intellectual property right. Note that the rightful claimant of the intellectual property right only has to obligate the manufacturing consignee to apply the marking to the product according to an agreement to be arranged between the rightful claimant and the manufacturing consignee established by the joint investment. A computer may control forming, recording, reading, and judging the marking using a program recorded on a recording medium.

Tenth Embodiment

Figure 14:
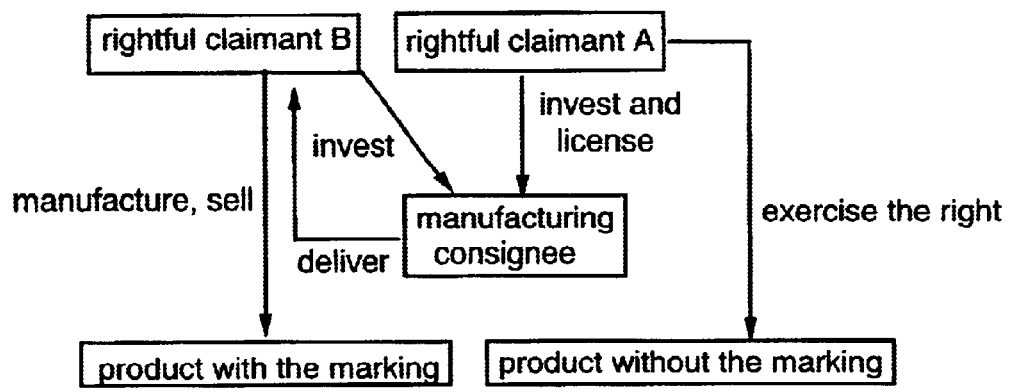
FIG. 14 shows a business form in which the present invention can be implemented.

As shown in FIG. 14, this embodiment is a form in which a rightful claimant A of an intellectual property right makes an investment jointly with a rightful claimant B of the intellectual property right to establish a manufacturing consignee and, at the same time, invests in and license the manufacturing consignee established by the joint investment to use the right, and applies a marking to a display module or a semiconductor integrated circuit in consigning manufacturing of the display module or the semiconductor integrated circuit. Note that, in addition to the investment, the rightful claimant B of the intellectual property right may license the manufacturing consignee to use the right pertaining to its own intellectual property right.

The rightful claimant A and the rightful claimant B of the intellectual property right may be a fabless or a person who has its own production line. In this case, the rightful claimant A or the rightful claimant B of the intellectual property right consigns manufacturing of a display module or a semiconductor integrated circuit to the manufacturing consignee, and the manufacturing consignee applies the marking to the product and delivers it to the rightful claimant B of the intellectual property right (manufacturing consignor). Note that, although the example in which the rightful claimant B of the intellectual property right sells the product is shown in this embodiment, the product may be sold by the rightful claimant A of the intellectual property right or may be sold by the manufacturing consignee. The manufacturing consignee includes a foundry.

In the business form described above, the rightful claimants of the intellectual property right can exercise the right considering that all products without the marking distributed in the market infringe the intellectual property right of the rightful claimants of the intellectual property right. Note that the rightful claimants of the intellectual property right only have to obligate the manufacturing consignee to apply the marking to the product according to an agreement to be arranged between the rightful claimants and the manufacturing consignee established by the joint investment. A computer may control forming, recording, reading, and judging the marking using a program recorded on a recording medium.

Eleventh Embodiment

Figure 15:
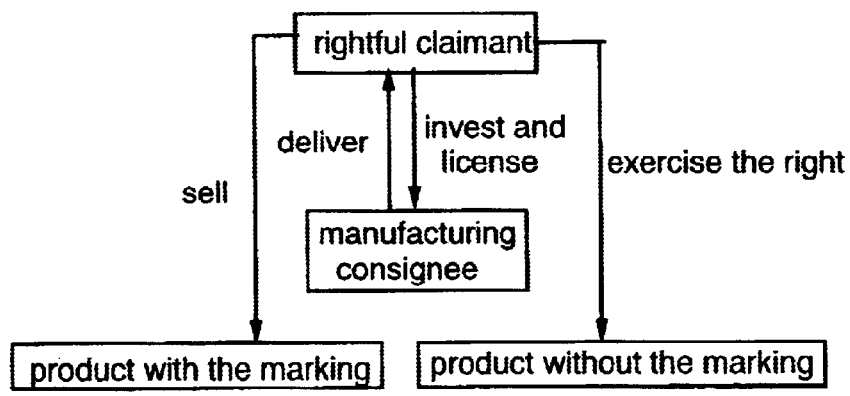
FIG. 15 shows a business form in which the present invention can be implemented.

As shown in FIG. 15, this embodiment is a form in which a rightful claimant of an intellectual property right makes an investment jointly with a manufacturing consignee to establish a production line of the manufacturing consignee and applies a marking to a display module or a semiconductor integrated circuit in manufacturing the display module or the semiconductor integrated circuit. The rightful claimant of the intellectual property right invests in and licenses the manufacturing consignee established by the joint investment to use a right pertaining to the intellectual property right.

The rightful claimant of the intellectual property right may be a fabless or may be a person owning its own production line. In this case, the rightful claimant of the intellectual property right consigns manufacturing of the display module or the semiconductor integrated circuit to the manufacturing consignee established by the joint investment, and the manufacturing consignee applies a marking to the product and delivers it to the rightful claimant of the intellectual property right (manufacturing consignor). Note that, although the example in which the product is sold by the rightful claimant of the intellectual property right is shown in this embodiment, the product may be sold by the manufacturing consignee. The manufacturing consignee includes a foundry.

In the business form described above, the rightful claimant of the intellectual property right can exercise the right considering that all products without the marking distributed in the market infringe the intellectual property right of the rightful claimant of the intellectual property right. Note that the rightful claimant of the intellectual property right only has to obligate the manufacturing consignee to apply the marking to the product according to an agreement to be arranged between the rightful claimants and the manufacturing consignee established by the joint investment. A computer may control forming, recording, reading, and judging the marking using a program recorded on a recording medium.

Twelfth Embodiment

Figure 16A:
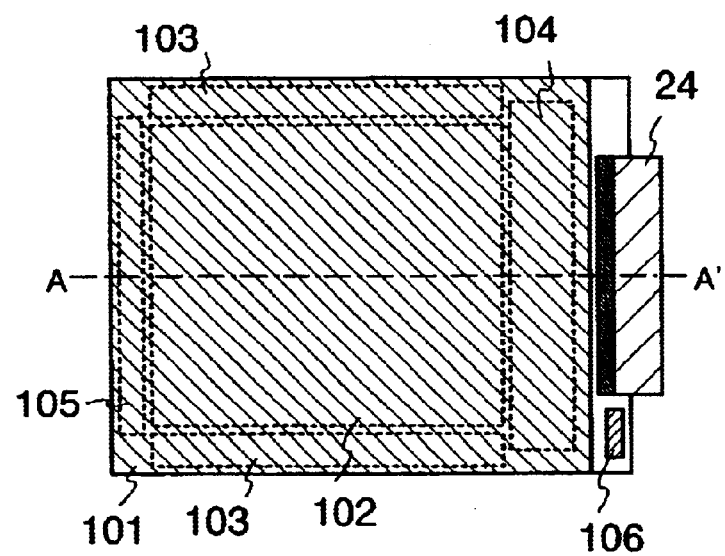
FIGS. 16A and 16B are views showing an EL display module in which the present invention is implemented.
Figure 16B:
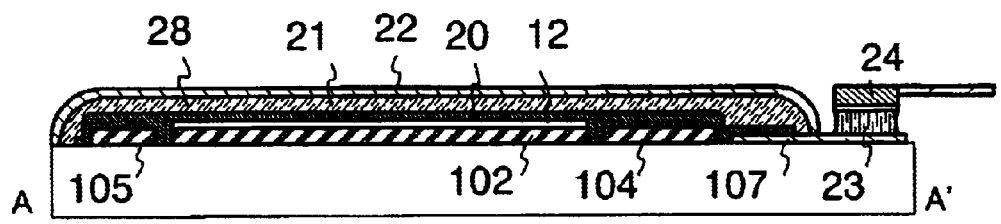

This embodiment shows, in FIGS. 16A and 16B, an example in which the present invention is implemented in an EL display module as one form of a display module in which the present invention can be implemented. FIG. 16A is a plan view of the EL display module completed as a product, and FIG. 16B is a sectional view of the plan view cut along A–A'. Note that in the EL display module or semiconductor integrated circuit shown in FIGS. 16A and 16B, for the portions denoted by the same reference numerals as those in FIG. 1, it is sufficient to refer to the description of FIG. 1. Here, portions required to be described are denoted by new reference numerals and described.

First, the active matrix substrate shown in FIG. 1 is prepared. The active matrix substrate is manufactured by a rightful claimant of an intellectual property right, a licensee of the intellectual property right, or a manufacturing consignee. Then, a receiver of the active matrix substrate as a product provides a light-emitting element 12 on the pixel section 102. The light-emitting element is an element for obtaining light emission according to the electroluminescence phenomenon and is constituted by an electrode for injecting holes (hereinafter referred to as anode) and an electrode for injecting luminous bodies and electrons (hereinafter referred to as cathode). A luminous body is a laminated body formed by laminating a light emitting layer, a carrier injection layer, a carrier transportation layer, a carrier blocking layer, and other organic compounds or inorganic compounds necessary for light emission. A structure of the luminous body may be any publicly known structure.

That is, the receiver of the active matrix substrate manufactured by the rightful claimant of the intellectual property right, the licensee of the intellectual property right, or the manufacturing consignee further applies a manufacturing process to the active matrix substrate, completes the EL display module shown in FIGS. 16A and 16B and sells it. Specific examples of the manufacturing process which the receiver can apply includes, after forming a light-emitting element 12, providing a silicon nitride film as a first protective film 20 and further providing an ultraviolet ray hardening resin film, an epoxy resin film, or a film of other resin as a second protective film 21, and providing a plastic film thereon as a cover material 22. Note that it is desirable to cover a surface of the plastic film with an inorganic insulating film such as a silicon nitride film to prevent moisture or oxygen from being transmitted through the plastic film. Moreover, it is sufficient to adhere a flexible print circuit (FPC) 24 using an anisotropic conductive film 23 to make an external terminal. It goes without saying that the specific example described here is only an example and does not limit the structure of the EL display module in which the present invention can be implemented.

In the EL display module described in this embodiment, at the time of manufacturing in any business form described in the first to eleventh embodiments, by carrying out the product management method of the present invention to apply a marking to each EL display module, attribution of an intellectual property right pertaining to the EL display module is clarified, and interests of a just rightful claimant of the intellectual property right such as royalty income through exercise of the right can be secured. A computer may control forming, recording, reading, and judging the marking using a program recorded on a recording medium.

Thirteenth Embodiment

Figure 17A:
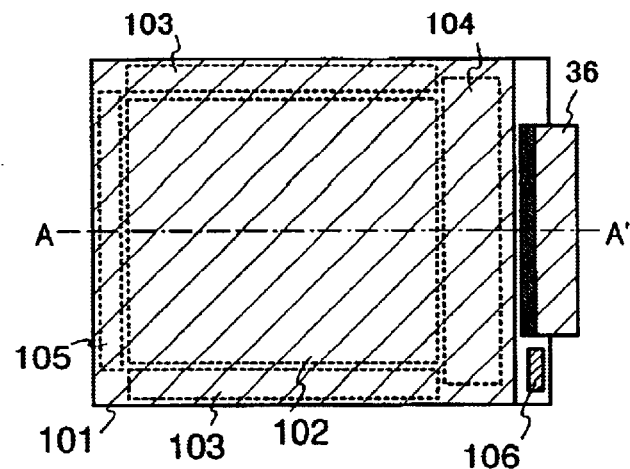
FIGS. 17A and 17B are views showing a liquid crystal display module in which he present invention is implemented.
Figure 17B:
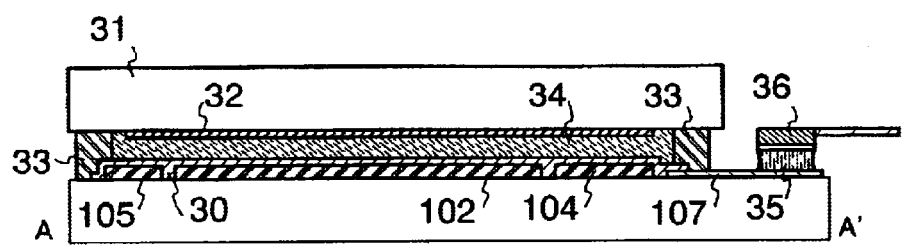

In this embodiment, an example in which the present invention is implemented in a liquid crystal display module is shown in FIGS. 17A and 17B as a form of a display module in which the present invention can be implemented. FIG. 17A is a plan view of the liquid crystal module completed as a product, and FIG. 17B is a sectional view of the plan view cut along A–A'. Note that, in the EL display module shown in FIG. 17A and 17B, for the portions denoted by the same reference numerals as those in FIG. 1, it is sufficient to refer to the description of FIG. 1. Here, portions required to be described are denoted by new reference numerals and described.

First, the active matrix substrate shown in FIG. 1 is prepared. The active matrix substrate is manufactured by a rightful claimant of an intellectual property right, a licensee of the intellectual property right, or a manufacturing consignee. Then, a receiver of the active matrix substrate as a product provides a liquid crystal element at least on the pixel section 102. The liquid crystal element is an element for controlling transmission or non-transmission of light according to an optical modulation action of liquid crystal and is constituted by a pair of electrodes and liquid crystal nipped between the pair of electrodes.

That is, the receiver of the active matrix substrate manufactured by the rightful claimant of the intellectual property right, the licensee of the intellectual property right, or the manufacturing consignee further applies a manufacturing process to the active matrix substrate, completes the liquid crystal display module shown in FIGS. 17A and 17B and sells it. Specific examples of the manufacturing process which the receiver can apply includes, providing an orientation film 30 on the active matrix substrate, providing a counter electrode 32 on a counter substrate 31 prepared in advance and, after sticking the counter substrate 31 and the active matrix substrate together using a seal material 33, injecting liquid crystal 34 between them to form a liquid crystal cell. Moreover, it is sufficient to adhere a flexible print circuit (FPC) 36 using an anisotropic to make an external terminal. It goes without saying that the specific example described here is only an example and does not limit the structure of the liquid crystal display module in which the present invention can be implemented.

In the liquid crystal display module described in this embodiment, at the time of manufacturing in any business form described in the first to eleventh embodiments, by carrying out the product management method of the present invention to apply a marking to each liquid crystal display module, attribution of an intellectual property right pertaining to the liquid crystal display module is clarified, and interests of a just rightful claimant of the intellectual property right such as royalty income through exercise of the right can be secured. A computer may control forming, recording, reading, and judging the marking using a program recorded on a recording medium.

Fourteenth Embodiment

Figure 22A:
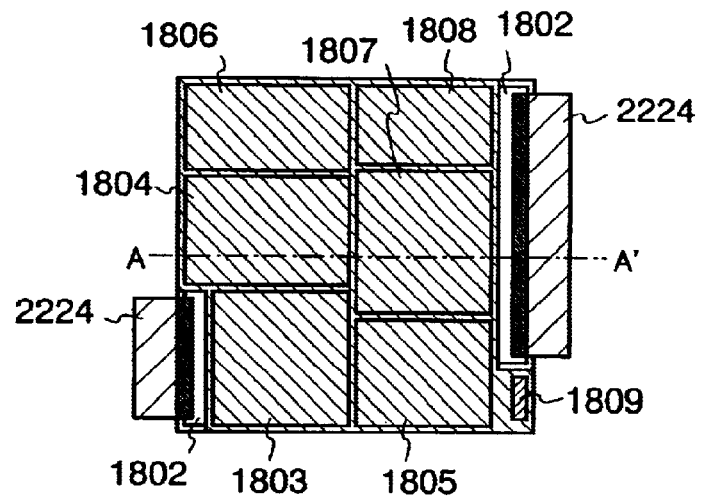
FIGS. 22A and 22B are views showing a semiconductor integrated circuit in which the present invention is implemented.
Figure 22B:
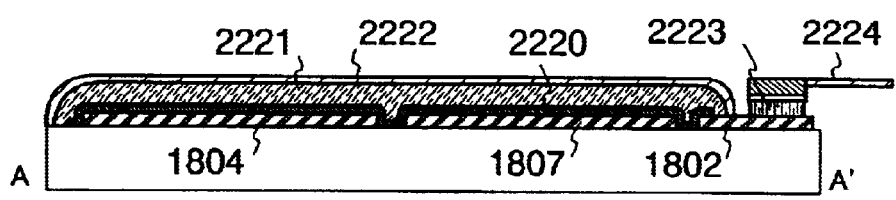

In this embodiment, an example in which the present invention is implemented in an EL semiconductor integrated circuit is shown in FIGS. 22A and 22B as a form of a semiconductor integrated circuit in which the present invention can be implemented. FIG. 22A is a plan view of the EL semiconductor integrated circuit completed as a product, and FIG. 22B is a sectional view of the plan view cut along A–A'. Note that, in the EL semiconductor integrated circuit shown in FIGS. 22A and 22B, for the portions denoted by the same reference numerals as those in FIG. 18, it is sufficient to refer to the description of FIG. 18. Here, portions required to be described are denoted by new reference numerals and described.

First, the logic substrate shown in FIG. 18 is prepared. The logic substrate is manufactured by a rightful claimant of an intellectual property right, a licensee of the intellectual property right, or a manufacturing consignee. Then, the manufacturer of the logic substrate or the receiver of the logic substrate only has to provide a first protective film 2220, a second protective film 2221, and a cover material 2222 on the logic substrate, and further adhere a flexible print circuit (FPC) 2224 using an anisotropic conductive film 2223 to make an external terminal. It goes without saying that the specific example described here is only an example and does not limit the structure of the EL semiconductor integrated circuit in which the present invention can be implemented.

That is, the logic substrate manufactured by the rightful claimant of the intellectual property right, the licensee of the intellectual property right, or the manufacturing consignee is finally sold as the semiconductor integrated circuit shown FIGS. 22A and 22B. Note that, as the first protective film 2220, it is sufficient to use an inorganic insulating film with a high barrier property against moisture and oxygen of a silicon nitride film or the like. In addition, as the second protective film 2221, it is preferable to provide an ultraviolet ray hardening resin film, an epoxy resin film, or a film of other resin. In this way, the second protective film 2221 can also serve as an adhesive for the cover material 2222 to be provided thereon. As the second protective film 2221, a plastic film having flexibility can be provided or a ceramic material can be simply provided. Note that it is desirable to cover a surface of the plastic film with an inorganic insulating film such as a silicon nitride film to prevent moisture or oxygen from being transmitted through the plastic film.

In the semiconductor integrated circuit described in this embodiment, at the time of manufacturing in any business form described in the first to eleventh embodiments, by carrying out the product management method of the present invention to apply a marking to each semiconductor integrated circuit, attribution of an intellectual property right pertaining to the semiconductor integrated circuit is clarified, and interests of a just rightful claimant of the intellectual property right such as royalty income through exercise of the right can be secured.

An effect of the present invention is to, in a manufacturing process of a transistor constituting a display module or a semiconductor integrated circuit, form characters, a figure, a symbol, or a numeral, or a combination thereof with any one of thin films constituting the transistor, and clarify attribution of an intellectual property right pertaining to the display module or the semiconductor integrated circuit through indication of the characters, the figure, the symbol, or the numeral, or the combination thereof. That is, the effect is to clarify a rightful claimant of an intellectual property right, a person licensed to use the intellectual property rights, or a person responsible for the intellectual property right. Further, by clarifying attribution of the intellectual property right, interests of a just rightful claimant of the intellectual property right can be secured. A computer may control forming, recording, reading, and judging the marking using a program recorded on a recording medium.

What is claimed is:

1. A product management method for a display module, comprising the steps of:

forming a marking concerning product-related matters of the display module using a thin film constituting the display module during a manufacturing process of the display module; and reading the marking to clarify the product-related matters of the display module.

2. The product management method according to claim 1, wherein the product-related matters of the display module contain at least one selected from the group consisting of a rightful claimant of an intellectual property right pertaining to the display module, a manufacturing consignee, a manufacturing consignor, a product receiver, a designer of the display module, and a serial number of the display module.

3. The product management method according to claim 1, wherein the display module is a liquid crystal display module.

4. The product management method according to claim 1, wherein the display module is an EL display module.

5. The product management method according to claim 1, wherein the display module is formed over a substrate having an insulating surface.

6. The product management method according to claim 1, wherein the marking comprises at least one of a character, a figure, a symbol, and a numeral.

7. The product management method according to claim 1, wherein a specific element is contained in a part of the thin film.

8. A product management method for a display module, comprising the steps of:

forming a marking concerning product-related matters of the display module using a thin film constituting the display module during a manufacturing process of the display module; and reading the marking to clarify the product-related matters of the display module, wherein the product-related matters of the display module are stored in a computer.

9. The product management method according to claim 8, wherein the product-related matters of the display module contain at least one selected from the group consisting of a rightful claimant of an intellectual property right pertaining to the display module, a manufacturing consignee, a manufacturing consignor, a product receiver, a designer of the circuit, and a serial number of the display module.

10. The product management method according to claim 8, wherein the display module is a liquid crystal display module.

11. The product management method according to claim 8, wherein the display module is an EL display module.

12. The product management method according to claim 8, wherein the display module is formed over a substrate having an insulating surface.

13. The product management method according to claim 8, wherein the marking comprises at least one of a character, a figure, a symbol, and a numeral.

14. The product management method according to claim 8, wherein a specific element is contained in a part of the thin film.

15. A product management method for a semiconductor integrated circuit, comprising the steps of:

forming a marking concerning product-related matters of the semiconductor integrated circuit using a thin film constituting the semiconductor integrated circuit during a manufacturing process of the semiconductor integrated circuit; and reading the marking to clarify the product-related matters of the semiconductor integrated circuit.

16. The product management method according to claim 15, wherein the product-related matters of the semiconductor integrated circuit contain at least one selected from the group consisting of a rightful claimant of an intellectual property right pertaining to the display module, a manufacturing consignee, a manufacturing consignor, a product receiver, a designer of the circuit, and a serial number of the display module.

17. The product management method according to claim 15, wherein the semiconductor integrated circuit is formed over a substrate having an insulating surface.

18. The product management method according to claim 15, wherein the marking comprises at least one of a character, a figure, a symbol, and a numeral.

19. The product management method according to claim 15, wherein a specific element is contained in a part of the thin film.

20. A product management method for a semiconductor integrated circuit, comprising the steps of:

forming a marking concerning product-related matters of the semiconductor integrated circuit using a thin film constituting the semiconductor integrated circuit during a manufacturing process of the semiconductor integrated circuit; and reading the marking to clarify the product-related related matters of the semiconductor integrated circuit, wherein the product-related matters of the semiconductor integrated circuit are stored in a computer.

21. The product management method according to claim 20, wherein the product-related matters of the semiconductor integrated circuit contain at least one selected from the group consisting of a rightful claimant of an intellectual property right pertaining to the display module, a manufacturing consignee, a manufacturing consignor, a product receiver, a designer of the circuit, and a serial number of the display module.

22. The product management method according to claim 20, wherein the semiconductor integrated circuit is formed over a substrate having an insulating surface.

23. The product management method according to claim 20, wherein the marking comprises at least one of a character, a figure, a symbol, and a numeral.

24. The product management method according to claim 20, wherein a specific element is contained in a part of the thin film.

25. A method for product management comprising:

outputting markings to the display modules;

recording the markings in a recording unit;

reading a marking formed on a display module in a market place using a reading unit; and determining whether or not any one of the markings recorded in the recording unit and the marking read by the reading unit coincide with each other.

26. The method according to claim 25, wherein the markings includes at least one of a character, a figure, a symbol, and a numeral.

27. The method according to claim 25, wherein a SIMS is used in the reading unit.

28. The method according to claim 25, wherein the markings to the display modules are changed in every fixed period.

29. A method for product management comprising:

outputting markings to semiconductor integrated circuits;

recording the markings in a recording unit;

reading a marking formed on a semiconductor integrated circuit in a market place using a reading unit; and determining whether or not any one of the markings recorded in the recording unit and the marking read by the reading unit coincide with each other.

30. The method according to claim 29, wherein the markings includes at least one of a character, a figure, a symbol, and a numeral.

31. The method according to claim 29, wherein a SIMS is used in the reading unit.

32. The method according to claim 29, wherein the markings to the display modules are changed in every fixed period.

33. A computer readable recording medium having a recorded program, the recorded program:

changing markings in a fixed period;

outputting the markings to display modules;

recording the markings in a recording unit; and reading a marking formed on a display module in a market place and determining whether or not the marking coincides with any one of the markings recorded in the recording unit.

34. A computer readable recording medium having a recorded program, the recorded program for:

changing markings in a fixed period;

outputting the markings to semiconductor integrated circuits;

recording the markings in a recording unit; and reading a marking formed on a semiconductor integrated circuit in a market place and determining whether or not the marking coincides with any one of the markings recorded in the recording unit.

* * * * *